United States Patent
Kubota

(10) Patent No.: US 7,102,176 B2
(45) Date of Patent: Sep. 5, 2006

(54) ORGANIC ELECTROLUMINESCENT DISPLAY PANEL AND MANUFACTURING METHOD THEREFOR

(75) Inventor: Hirofumi Kubota, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 165 days.

(21) Appl. No.: 10/394,509

(22) Filed: Mar. 24, 2003

(65) Prior Publication Data

US 2003/0209708 A1 Nov. 13, 2003

(30) Foreign Application Priority Data

Mar. 25, 2002 (JP) .................................... 2002-082513

(51) Int. Cl.
*H01L 33/00* (2006.01)

(52) U.S. Cl. .............................. 257/98; 257/79; 257/86; 257/88; 438/22; 438/30

(58) Field of Classification Search ................... 257/79, 257/86, 88, 98; 438/22, 30
See application file for complete search history.

(56) References Cited

U.S. PATENT DOCUMENTS 6,198,217 B1 * 3/2001 Suzuki et al. ............... 313/504

| | | | | |
|---|---|---|---|---|
| 2002/0093285 A1 * | 7/2002 | Sugimoto et al. | ........... | 313/506 |
| 2003/0113581 A1 * | 6/2003 | Gotou | ........................ | 428/690 |
| 2003/0117066 A1 * | 6/2003 | Silvernail | .................... | 313/504 |
| 2003/0164497 A1 * | 9/2003 | Carcia et al. | .................. | 257/40 |
| 2003/0184219 A1 * | 10/2003 | Duggal et al. | .............. | 313/506 |
| 2003/0207488 A1 * | 11/2003 | Carcia et al. | ................. | 438/82 |

* cited by examiner

*Primary Examiner*—Long Pham
(74) *Attorney, Agent, or Firm*—Sughrue Mion, PLLC

(57) ABSTRACT

An organic electroluminescent display panel includes: one or more organic electroluminescent elements each having first and second display electrodes and one or more organic functional layers of organic compounds sandwiched and layered between the first and second display electrodes, the organic functional layers including a light-emitting layer; and a substrate supporting the organic electroluminescent elements. The display panel also includes: a first inorganic barrier film covering the organic electroluminescent elements and a surface of the substrate around the one or more organic electroluminescent elements; a first high-molecular compound film having an area larger than each of the organic electroluminescent elements so as to partially cover the first inorganic barrier film thereover; and a second inorganic barrier film covering the first high-molecular compound film and an edge thereof.

10 Claims, 5 Drawing Sheets

ORGANIC ELECTROLUMINESCENT DISPLAY PANEL AND MANUFACTURING METHOD THEREFOR

BACKGROUND OF THE INVENTION

1. Field of the Invention

The present invention relates to an organic electroluminescent element (hereinafter referred to as an organic EL element) comprising one or more organic thin films (hereinafter referred to as an organic functional layer) including a light-emitting layer consisting of organic compound material which exhibits electroluminescence when electrical current is injected thereto. More particularly, the present invention relates to an electroluminescent display panel (hereinafter referred to as organic EL display panel) with one or more organic EL elements formed on a substrate.

2. Description of the Related Art

The organic EL element fundamentally comprises an anode and a cathode with one or more organic functional layers layered between them. In the light-emitting layer of the organic EL element, an electron and a hole injected from both electrodes recombine with each other to form an exciton. When the exciton changes its state from an excited state to a basic state, it emits light. For example, an organic EL element has an anodic transparent electrode, an organic functional layer, and a cathodic metal electrode, which are sequentially deposited on a transparent substrate so as to emit light through the transparent substrate side. The organic functional layer can be formed in a laminate form of a single light-emitting layer, or of a three-layer structure which includes an organic hole transport layer, a light-emitting layer and an organic electron transport layer, or of a two-layer structure which includes an organic hole transport layer and a light-emitting layer. At least one of an electron injection layer, a hole injection layer and a carrier block layer may be inserted among the abovementioned layered layers and both electrodes.

As organic EL display panels, for example, the matrix display type and the panel having a predetermined luminescence pattern are well known.

When this organic EL element is exposed to the atmosphere, it is easily degraded by water, gasses such as oxygen, and some type of molecule in the operating environment. In particular, the properties of the interface between the electrode of the organic EL element and the organic functional layer deteriorate markedly, and the luminescent properties, such as brightness and color, also deteriorate. To prevent such adverse influences, in the case of the organic EL display panel, the organic EL element is sealed with a single inorganic protective film, such as silicon oxide, to restrain its deterioration. However, such a protective film does not have sufficient barrier properties. That is, it is impossible to avoid the generation of pinholes in the inorganic barrier film. When pinholes are formed in the protective film, then water, oxygen or the like can penetrate the film, and a non-luminescent spot of the organic EL element, a so-called dark spot, spreads out.

OBJECT AND SUMMARY OF THE INVENTION

It is an object of the present invention to provide an organic EL element and an organic EL display panel having an excellent shielding effect against oxygen, water or the like to protect the organic functional layer and the electrode from them, and having degradation-resistant luminescent properties.

According to the present invention, there is provided an organic electroluminescent display panel comprising:

one or more organic electroluminescent elements each having first and second display electrodes and one or more organic functional layers of organic compounds sandwiched and layered between said first and second display electrodes, the organic functional layers including a light-emitting layer;

a substrate supporting said organic electroluminescent elements;

a first inorganic barrier film covering said organic electroluminescent elements and a surface of the substrate around said one or more organic electroluminescent elements;

a first high-molecular compound film having an area larger than each of said organic electroluminescent elements so as to partially cover said first inorganic barrier film thereover; and a second inorganic barrier film covering said first high-molecular compound film and an edge thereof.

In the organic electroluminescent display panel according to the invention, said first high-molecular compound film is formed to have an area smaller than that of said first inorganic barrier film and larger than each of said organic electroluminescent elements.

In the organic electroluminescent display panel according to the invention, said first high-molecular compound film is formed to cover said first inorganic barrier film, an edge thereof, and a surface of the substrate around said first inorganic barrier film.

The organic electroluminescent display panel according to the invention further comprises a second high-molecular compound film having an area larger than each of said organic electroluminescent elements so as to partially cover said second inorganic barrier film thereover; and a third inorganic barrier film covering said second high-molecular compound and an edge thereof.

In the organic electroluminescent display panel according to the invention, said inorganic barrier film is made of silicon nitride or silicon oxynitride.

In the organic electroluminescent display panel according to the invention, said inorganic barrier film is formed by a plasma chemical vapor deposition process or a sputter deposition process or a catalytic chemical vapor deposition.

In the organic electroluminescent display panel according to the invention, said high-molecular compound film is formed by a plasma polymerization deposition process or a chemical vapor deposition process or a vapor deposition polymerization.

In the organic electroluminescent display panel according to the invention, said high-molecular compound film is made of polyparaxylylene or polyurea.

In the organic electroluminescent display panel according to the invention, said substrate is a plastic substrate made of a high-molecular compound.

The organic electroluminescent display panel according to the invention further comprises an inorganic barrier film previously formed on the plastic substrate so as to cover a surface supporting said organic electroluminescent elements on said plastic substrate.

According to the present invention, there is provided method of manufacturing an organic electroluminescent display panel comprising one or more organic electroluminescent elements and a substrate supporting the organic electroluminescent elements, comprising the steps of:

forming one or more organic electroluminescent elements on a substrate, each having first and second display electrodes and one or more organic functional layers of organic compounds sandwiched and layered between said first and second display electrodes, the organic functional layers including a light-emitting layer;

forming a first inorganic barrier film having an area larger than each of said organic electroluminescent elements so as to cover said organic electroluminescent elements;

forming a first high-molecular compound film so as to cover said first inorganic barrier film, an edge thereof, and a surface of the substrate around said first inorganic barrier film; and forming a second inorganic barrier film having an area larger than said first high-molecular compound film so as to cover said first high-molecular compound film, an edge thereof, and a surface of the substrate around said first high-molecular compound film.

In the manufacturing method of the organic electroluminescent display panel according to the invention, said first high-molecular compound film is formed to have an area smaller than that of said first inorganic barrier film and larger than each of said organic electroluminescent elements.

In the manufacturing method of the organic electroluminescent display panel according to the invention, said first high-molecular compound film is formed to cover said first inorganic barrier film, an edge thereof, and a surface of the substrate around said first inorganic barrier film.

In the manufacturing method of the organic electroluminescent display panel according to the invention, a second high-molecular compound film having an area larger than each of said organic electroluminescent elements so as to partially cover said second inorganic barrier film thereover; and a third inorganic barrier film covering said second high-molecular compound and an edge thereof.

In the manufacturing method of the organic electroluminescent display panel according to the invention, said inorganic barrier film is made of silicon nitride or silicon oxynitride.

In the manufacturing method of the organic electroluminescent display panel according to the invention, said inorganic barrier film is formed by a plasma chemical vapor deposition process or a sputter deposition process or a catalytic chemical vapor deposition.

In the manufacturing method of the organic electroluminescent display panel according to the invention, said high-molecular compound film is formed by a plasma polymerization deposition process or a spin-coating process or a vapor deposition polymerization.

In the manufacturing method of the organic electroluminescent display panel according to the invention, said high-molecular compound film is made of polyparaxylylene.

BRIEF DESCRIPTION OF THE DRAWINGS

The aforementioned aspects and other features of the invention are explained in the following description, taken in connection with the accompanying drawing figures wherein.

DETAILED DESCRIPTION OF THE PREFERRED EMBODIMENTS

The inventor conducted experiments on a two-layer sealed construction comprising a high-molecular compound film in contact with an organic EL element and an inorganic barrier film formed thereon, because only an inorganic barrier film cannot seal an organic EL element sufficiently.

In the experiments, a high-molecular compound film of photo-setting epoxy resin was used. When the resultant organic EL element was kept under a high temperature, then the high-molecular compound film generated outgas from photo-polymerization initiator residue in the resin or a by-product or the like contributed to the reaction. Such outgas attacked the organic EL element itself to cause the spread of the dark spot and the luminance deterioration. The inventor suggests to make a multi-layered film for a protective film in which an inorganic barrier film such as silicon nitride, a high-molecular compound film, another inorganic barrier film, another high-molecular compound film is layered in order. In this way, a highly reliable organic EL display panel can be provided by providing to a contact portion of the multilayered organic EL element with an inorganic film without outgasing, so that the organic EL display panel can prevent the spread of the dark spot and the invasion of oxygen, moisture or the like from the outside.

An exemplary embodiment of the present invention is described below with reference to the accompanying drawings.

Figure 1:
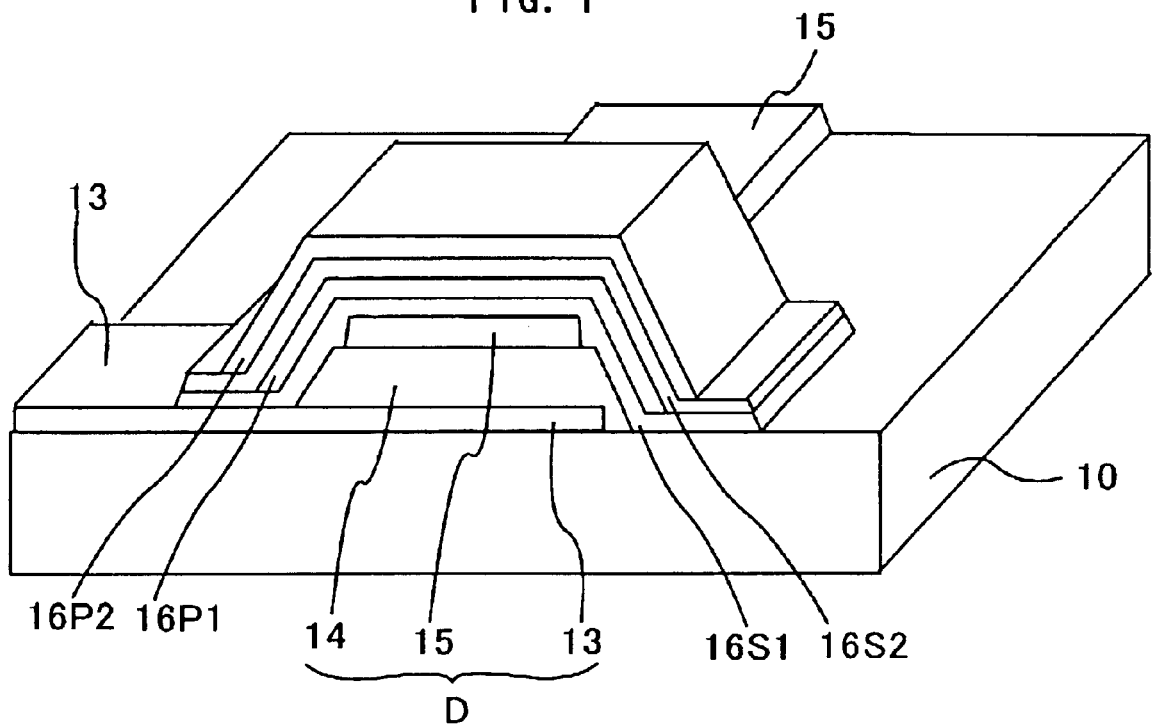
FIG. 1 is a schematic perspective view of an organic EL element according to an embodiment of the present invention.

FIG. 1 shows an organic EL element D according to an embodiment of the present invention. The organic EL element of this embodiment comprises a first display electrode 13 (i.e., anode of a transparent electrode), one or more organic functional layers 14 including a light-emitting layer of an organic compound or more, and a second display electrode 15 (i.e., cathode of a metallic electrode) formed on a substrate 10 made of glass, or the like. In addition, the organic EL element is sealed by a multi-layered film covering the back of the second display electrode 15. The multi-layered film comprises a first inorganic barrier film 16S1, a first high-molecular compound film 16P1, a second inorganic barrier film 16S2 and a second high-molecular compound film 16P2. The first inorganic barrier film 16S1 covers the organic electroluminescent element D and a surface of the substrate 10 around the organic electroluminescent element. The first high-molecular compound film 16P1 partially covers the first inorganic barrier film 16S1, but not the edge thereof. The second inorganic barrier film 16S2 cover the first high-molecular compound film 16P1, an edge thereof, and a surface of the first inorganic barrier film 16S1 around the first high-molecular compound film. The second high-molecular compound film 16P2 has an area larger than the organic electroluminescent element D so as to partially cover the second inorganic barrier film 16S2 over the organic electroluminescent element. The second high-molecular compound film 16P2 may cover the second inorganic barrier film 16S2, an edge thereof, and a surfaces of the first inorganic barrier film 16S1 and the substrate around it. The internal high-molecular compound films are formed to be embedded in the pair inorganic barrier films to keep within the inorganic barrier films. Although the edges of inorganic barrier films are not always covered with the high-molecular compound films, the last inorganic barrier film is covered with a high-molecular compound film when it is the most upper surface film. Any material can be used for the substrate 10, so it can be selected from any inorganic material such as glass and any organic material such as a high-molecular compound.

Figure 2:
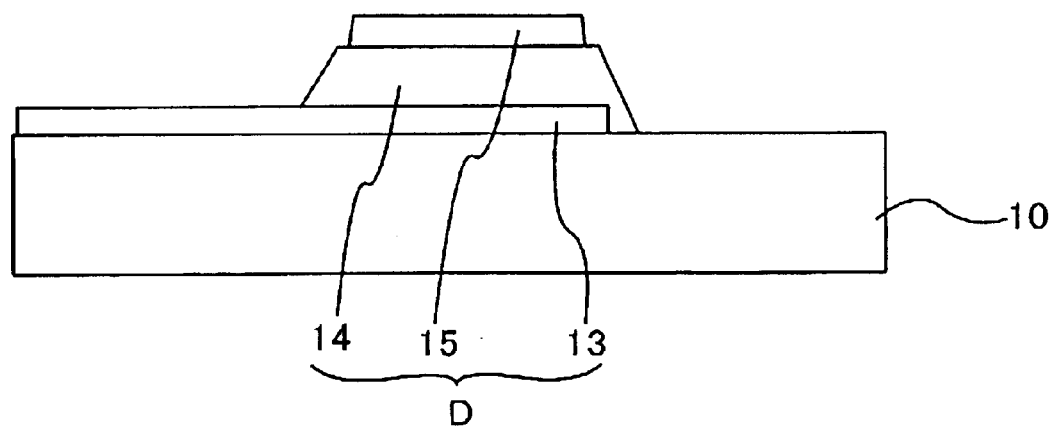
FIGS. 2–6 are schematic cross-sectional views each showing a substrate in the manufacturing process of an organic EL display panel according to the present invention.

For example, as shown in FIG. 2, in a manufacturing process for the organic EL element, the first display electrode 13 consisting of indium-tin oxide (ITO) is evaporated or sputtered on the substrate 10 to form a thin film. The organic functional layers or laminate 14 is formed thereon by evaporating a hole injection layer consisting of copper phthalocyanine, a hole transport layer consisting of TPD (triphenylamine derivative), a light-emitting layer consisting of Alq3 (aluminum chelate complex), and an electron injection layer consisting of $Li_2O$ (lithium oxide) successively. In addition, the second display electrode 15 made of aluminum is formed by evaporation in such a manner that it faces the electrode pattern of the transparent electrode 13 and the organic functional layer 14. In this way, an organic EL element D is fabricated.

Figure 3:
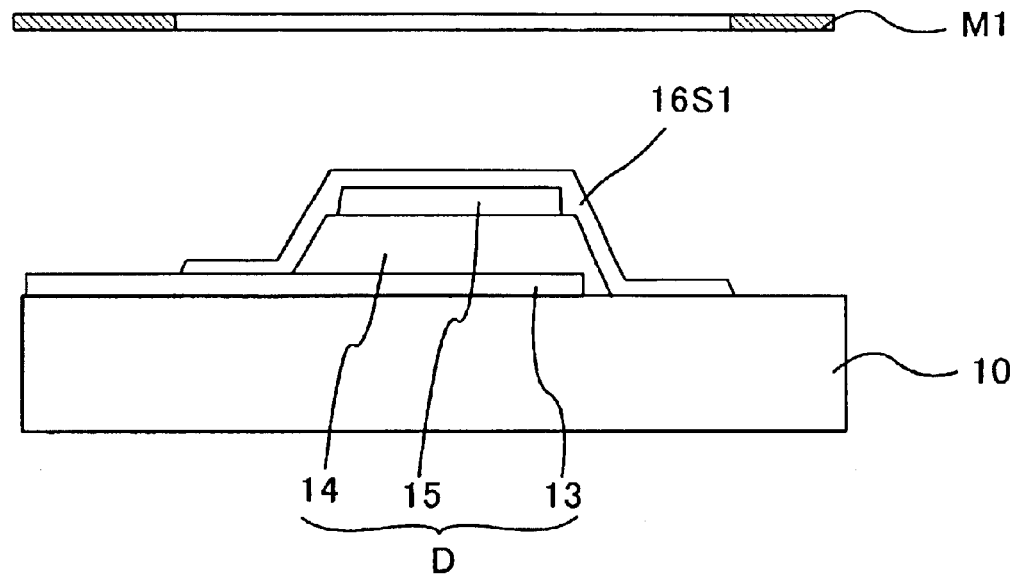

Next, as shown in FIG. 3, a first inorganic barrier film 16S1 of silicon nitride is formed on the organic EL element D by CVD (chemical vapor deposition) process so as to entirely cover the organic EL element D. In this case, the first inorganic barrier film 16S1 is formed to have an area larger than a display area containing pixels or the organic EL element by a first apertured mask M1.

Figure 4:
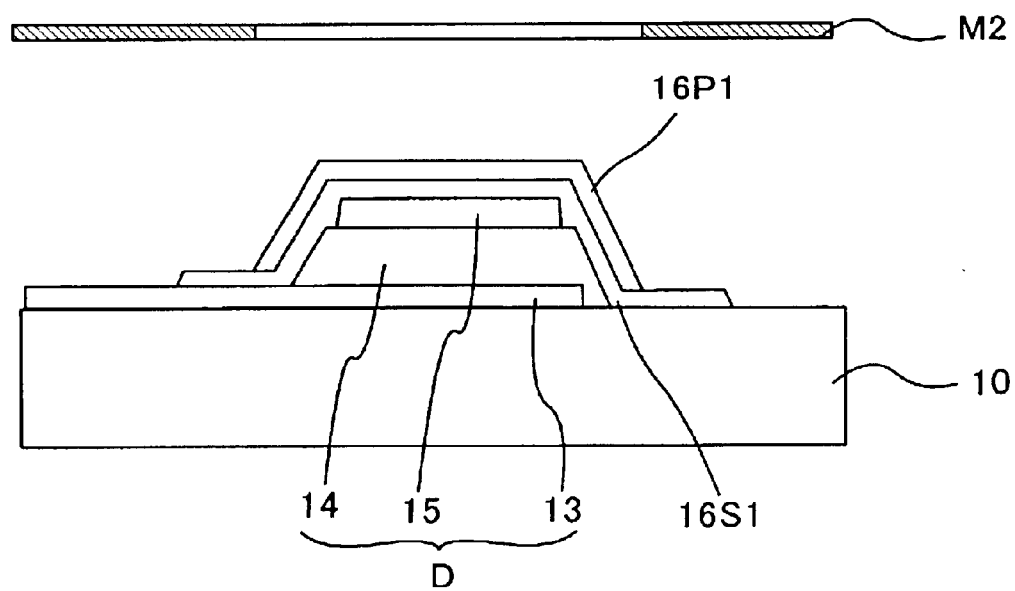

Next, as shown in FIG. 4, a first high-molecular compound film 16P1 of polyethylene is formed on the first inorganic barrier film 16S1 by CVD. In this case, the first high-molecular compound film 16P1 is formed by a second apertured mask M2 so as to have an area smaller than that of the first inorganic barrier film and larger than that of the organic electroluminescent element included in the display resign.

Figure 5:
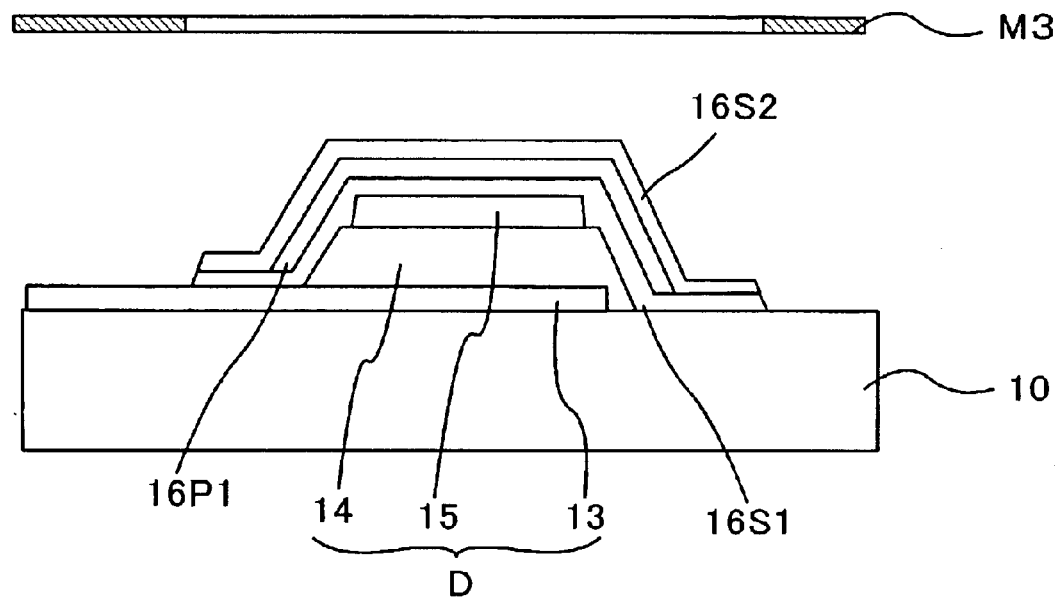

Next, as shown in FIG. 5, a second inorganic barrier film 16S2 of silicon nitride of polyethylene is formed on the first high-molecular compound film 16P1 by plasma CVD process. In this case, the second inorganic barrier film 16S2 is formed by a third apertured mask M3 so as to have an area larger than that of the first high-molecular compound film.

Figure 6:
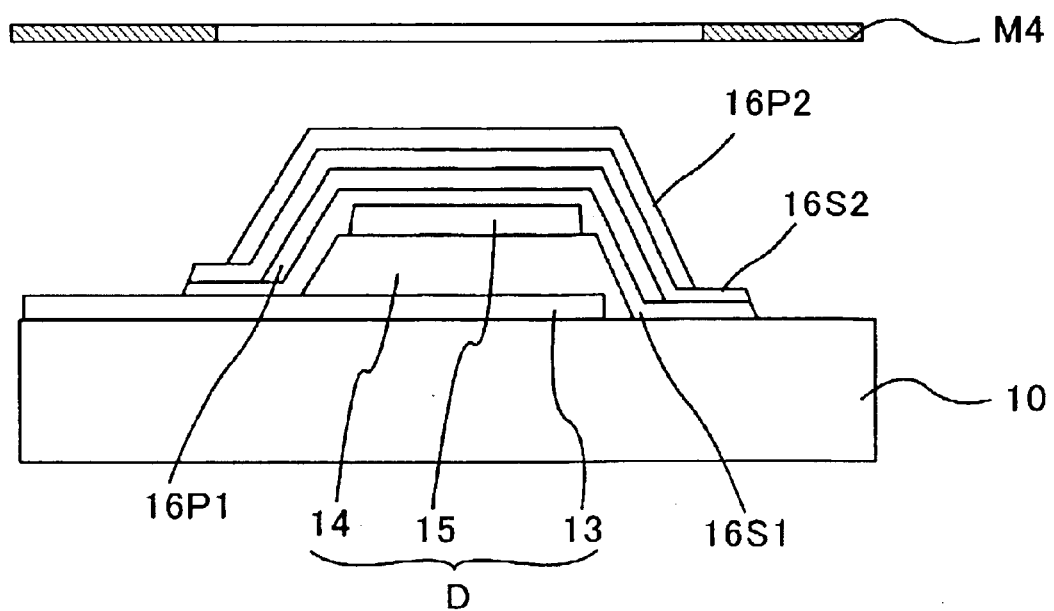

Next, as shown in FIG. 6, a second high-molecular compound film 16P2 of polyethylene is formed on the second inorganic barrier film 16S2 by CVD to form an organic EL display panel shown in FIG. 1. In this case, the second high-molecular compound film 16P2 is formed by a fourth apertured mask M4 so as to have an area smaller than that of the second inorganic barrier film 16S2. In addition, the second high-molecular compound film 16P2 may be formed by another apertured mask having a opening larger than that of the second inorganic barrier film 16S2. In this embodiment, the high-molecular compound film is embedded between the pair inorganic barrier films, and one of the inorganic barrier films is always in contact with the organic EL element.

The plasma polymerizing process for forming the high-molecular compound film 16P is a process in which organic molecules are converted into a plasma state and are polymerized by the coupling of the radicals generated. With the plasma polymerizing process, if a monomer has a vapor pressure, a fine, thin high-molecular compound film can be obtained without using a special polymerizing group such as a vinyl group. According to the embodiment, plasma polymerization is performed in an alternating current plasma polymerizing device. However, a direct-current plasma process using an anode and a cathode may also be used for plasma polymerization.

Examples of the raw material for the high-molecular compound film include a hydrocarbon monomer, such as methane, ethane, propane, butane, pentane, ethylene, propylene, butene, butadiene, acetylene, or methyl acetylene; a silicon monomer, such as hexamethyldisiloxane, triethoxyvinylsilane, polydimethylsiloxane, or tetramethoxysilane; and a hydrogen fluoride monomer, such as tetrafluoroethylene. A high-molecular compound film substantially consisting only of carbon and hydrogen is preferable because it can form a fine, hard film free from pinholes. The ratio of atoms (atomic composition ratio) of H/C=1.5 or smaller is preferable because a three-dimensionally sufficiently cross-linked high-molecular compound film having excellent properties can be formed. Such a high-molecular compound film can be formed by decreasing the amount of the hydrocarbon monomer gas, by reducing the reaction pressure, and by increasing the electric power applied. That is, by reducing the reaction pressure and by increasing the electric power applied, the decomposition energy per monomer unit increases, so decomposition is accelerated and a cross-linked high-molecular compound film can be formed. In addition, a gas, such as hydrogen, inert gas or the like may be used as a carrier gas.

A high-molecular compound film formed by CVD (chemical vapor deposition) is preferable. Because a polyparaxylylene polymerized film, especially, a paraxylylene polymerized film or a chlorinated paraxylylene polymerized film, has extremely low gas and steam permeability, the mixing in of impurities can be restrained and a uniform film with fewer pinholes can be obtained. Examples of such xylene resins are Palylene N (polyparaxylylene), Palylene C (polymonochloroparaxylylene), and Palylene D (polydichloroparaxylylene) commercially available from Union Carbide Co., Ltd. in the U.S. Palylene C is preferable because of its low gas permeability. However, Palylene N will do because the SiN film is formed thereon. A high-molecular compound film such as polyparaxylylene film can be obtained by thermally decomposing a gas of a dimer under reduced pressure.

In the experiments, a predetermined organic functional layer was formed on the ITO anode surface of a glass substrate, and an aluminum cathode film was formed thereon to form an organic EL element. Next, a first inorganic barrier film of silicon nitride was formed by plasma CVD process so as to entirely cover the organic EL element. Then, a first high-molecular compound film of polyethylene was formed by plasma polymerization to have an area larger than that of the organic electroluminescent element and smaller than that of the first inorganic barrier film. Further, a second inorganic barrier film of silicon nitride was formed by plasma CVD process so as to have an area larger than that of the organic electroluminescent element and cover the edge of the first high-molecular compound film. In this way, an organic EL display panel according to the embodiment was fabricated. A 0.5 μm-thick high-molecular compound film was formed by plasma-polymerization from 20 SCCM ethylene gas under the following conditions pressure was 0.9 Torr, RF power was 500 mW/cm$^2$, frequency was 13.56 MHz, and temperature was room temperature. For comparison's sake, there was also formed an organic EL display panel having the same structure as the embodiment mentioned above except a high-molecular compound film of photo-setting epoxy resin was formed to be contact with the organic EL element without the first inorganic barrier film. Its durability was tested by measuring the spread of the dark spot of the organic EL element in the atmosphere at 60° C. and 95% RH. According to the embodiment, the dark spot did not spread out, but the test piece for comparison showed the spread of the dark spot.

Figure 7:
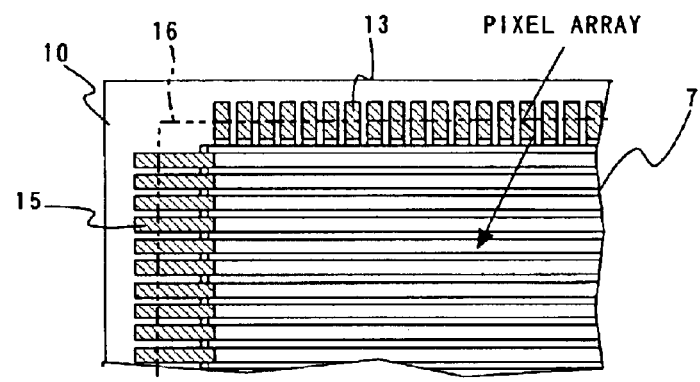
FIG. 7 is a partial enlarged rear view of an organic EL display panel comprising a plurality of organic EL elements according to another embodiment of the present invention.

FIG. 7 is a partial enlarged rear view of an organic EL display panel comprising a plurality of organic EL elements. The organic EL display panel comprises a plurality of organic EL elements arranged in the form of a matrix on the substrate 10. A row electrode 13 (a first display electrode of the anode) including a transparent electrode layer, an organic functional layer, and a column electrode 15 (a second display electrode) including a metallic electrode layer intersecting with said row electrode are formed successively on the substrate 10. Each row electrode is formed in the form of a band and arranged so that it is parallel with an adjacent row electrode with a predetermined interval between them. The same is true of the column electrodes. As described above, the display panel of the matrix display type has a picture display array comprising luminescent pixels of a plurality of organic EL elements formed at intersections of a plurality of rows and a plurality of columns. The organic EL display panel may comprise a plurality of partition walls 7 installed in parallel between the organic EL elements arranged on the substrate 10. A multilayer protective laminate 16 is formed on the second display electrode 15 and the partition walls 7 so as to cover a plurality of organic EL elements. The multilayer protective laminate 16 has alternate layers of the abovementioned inorganic barrier films and the high-molecular compound films which can be formed by repeating the above process. Luminescent spots of red R, green G and blue B may be formed by selecting and laminating organic functional layer materials appropriately.

Figure 8:
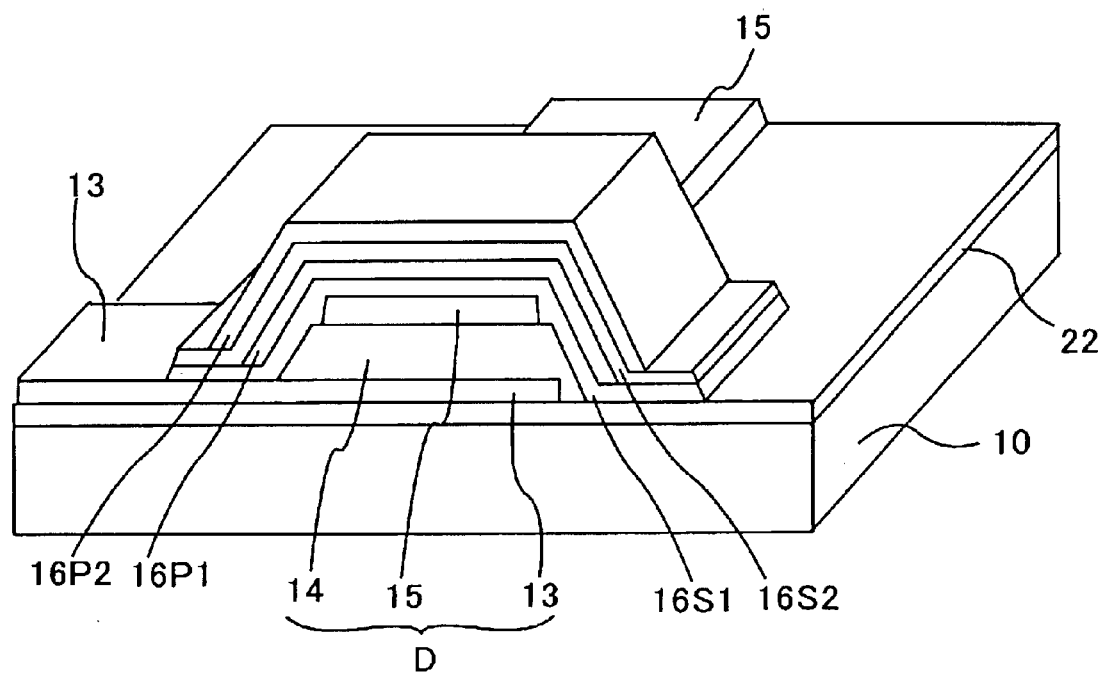
FIGS. 8–10 are schematic perspective views each showing an organic EL element according to another embodiment of the present invention.

FIG. 8 shows an organic EL element according to another embodiment of the present invention. This organic EL element is the same as that of the embodiment in FIG. 1 except that the substrate 10 is made of plastic using synthetic resin, and its surface is covered with an inorganic barrier film 22 on the substrate consisting of an inorganic material, such as silicon nitride or silicon oxynitride. An organic EL element electrode is formed on the inorganic barrier film 22 on the substrate. As the synthetic resin substrate, a film of polyethylene terephthalate, polyethylene-2, 6-naphthalate, polycarbonate, polysulfone, polyethersulfone, polyether ether ketone, polyphenoxyether, polyalylate, fluororesin, polypropylene or the like can be applied It is preferable that the surface of the plastic substrate covered with the inorganic barrier film 22 on the substrate includes at least a surface in contact with the organic EL elements, a surface between the organic EL elements, a surface around the organic EL elements, and a surface on the reverse side of the surface in contact with the organic EL elements. These surfaces can prevent the invasion of outgas etc. from the plastic substrate into the organic functional layer. Warping of the plastic substrate can be prevented by covering both sides of the plastic substrate with the inorganic barrier film 22 on the substrate.

Although the above-mentioned embodiment employs the plasma CVD process to form the inorganic barrier film, any vapor deposition method, such as sputter deposition or a catalytic chemical vapor deposition or vacuum evaporation may be used, if so desired. It is not limited to plasma polymerization deposition process for forming the high-molecular compound film. In addition to plasma polymerization deposition process, there can be selected chemical vapor deposition or spin-coating process or a vapor deposition polymerization(VDP). Since the inorganic barrier film and the high-molecular compound film are alternately layered, a fluid resin such as a photo-setting resin can be used by spin-coating process for the high-molecular compound film. Therefore, the number of selection for forming the high-molecular compound film increases. VDP of diamino-diphenyl-ether and diphenyle-mehtane-diisocyanate can be used for a polyurea film. In the case of the above-mentioned embodiment, the organic EL display panel of the simple matrix display type was described. The present invention is also applicable to any panel substrate of the active matrix display type using TFT (thin film transistors) or the like.

Figure 9:
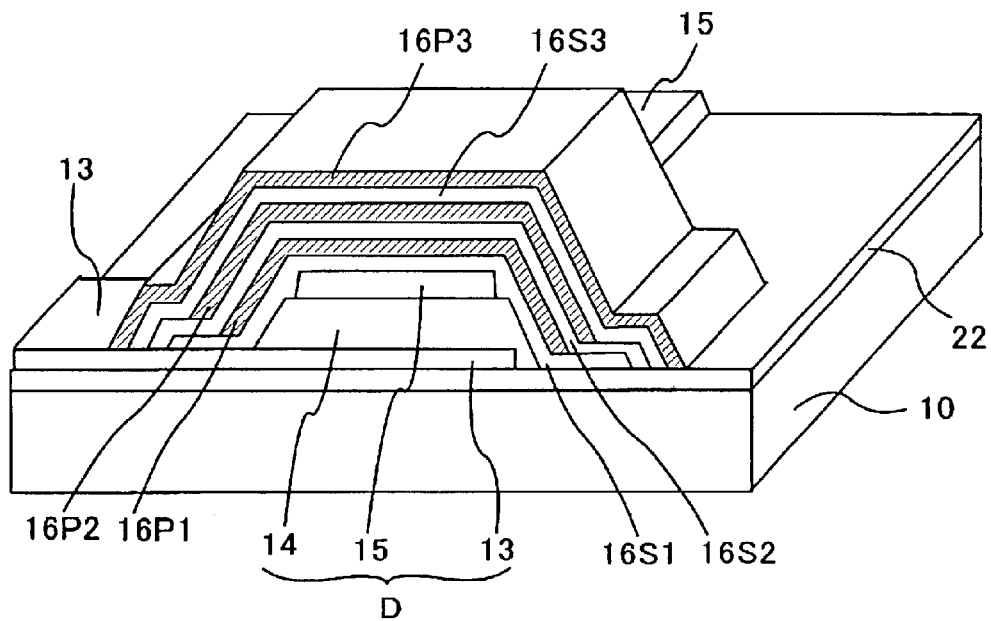

FIG. 9 shows an organic EL element D of another embodiment according to the present invention. This embodiment has a structure so that an organic EL element D is formed on the inorganic barrier film 22 of the substrate and protected by a multi-layered sealing film covering the back of the second display electrode 15 thereof. The organic EL element D comprises a first inorganic barrier film 16S1, a first high-molecular compound film 16P1, a second inorganic barrier film 16S2, a second high-molecular compound film 16P2, a third inorganic barrier film 16S3 and a third high-molecular compound film 16P3. In this way, in case that the high-molecular compound film and the inorganic barrier film are alternately layered each other as a multilayer structure, both the film-forming steps of the high-molecular compound film and the inorganic barrier film are repeated.

Figure 10:
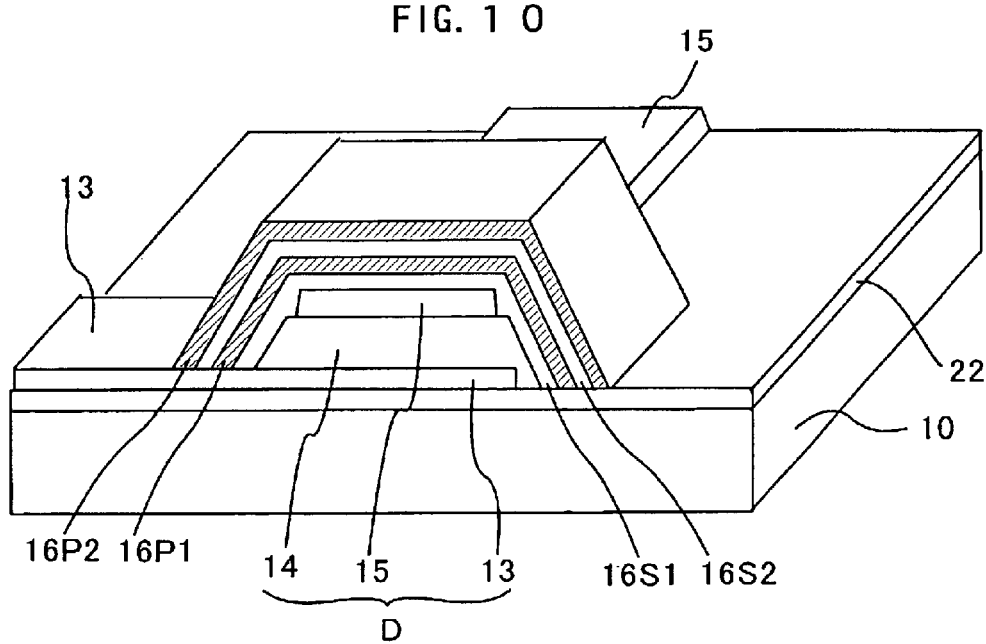

In another embodiment of an organic EL element D shown in FIG. 10 according to the invention, the first inorganic barrier film 16S1 covers the organic electroluminescent element D and a surface of the substrate 10 around the organic electroluminescent element. The first high-molecular compound film 16P1 partially covers the first inorganic barrier film 16S1 and a surface of the substrate 10 around the first inorganic barrier film. The second inorganic barrier film 16S2 cover the first high-molecular compound film 16P1, an edge thereof, and a surface of the substrate around the first high-molecular compound film. The second high-molecular compound film 16P2 covers the second inorganic barrier film 16S2, an edge thereof, and a surface of the substrate around the second inorganic barrier film 16S2. When an opening of the apertured mask in one film-forming step is larger than that of the preceding film-forming step, the edge of the previously layered film is covered with the recent layered film. In this way, every embodiment has a structure in that the internal high-molecular compound film including the edge thereof is covered or embedded with the pair inorganic barrier films, and one of the inorganic barrier films is always in contact with the organic EL element.

According to the present invention, the inorganic barrier film such as silicon nitride is provided so as to be in contact with the organic EL element and then the high-molecular compound film is layered on the inorganic barrier film. Therefore the deterioration of the organic EL element caused by outgas from the high-molecular compound film is avoided. Also, there is dissolved the problem in that outgas from the high-molecular compound film covering the organic EL element damages the organic EL element itself. In addition, it is possible to prevent the invasion of water and oxygen through the edge of the high-molecular compound film, and a sealing construction with an efficient sealing effect against water and oxygen can be achieved, so the organic EL element is sufficiently protected. Therefore, a highly durable organic EL display panel can be provided.

It is understood that the foregoing description and accompanying drawings set forth the preferred embodiments of the invention at the present time. Various modifications, additions and alternative designs will, of course, become apparent to those skilled in the art in light of the foregoing teachings without departing from the spirit and scope of the disclosed invention. Thus, it should be appreciated that the invention is not limited to the disclosed embodiments but may be practiced within the full scope of the appended claims.

This application is based on a Japanese Patent Application No. 2002-82513 which is hereby incorporated by reference.

What is claimed is:

1. An organic electroluminescent display panel comprising:
   one or more organic electroluminescent elements each having first and second display electrodes and one or more organic functional layers of organic compounds sandwiched and layered between said first and second display electrodes, the organic functional layers including a light-emitting layer;
   a substrate supporting said organic electroluminescent elements;
   a first inorganic barrier film covering said organic electroluminescent elements and a surface of the substrate around said one or more organic electroluminescent elements;
   a first high-molecular compound film having an area larger than each of said organic electroluminescent elements so as to partially cover said first inorganic barrier film thereover; and
   a second inorganic barrier film covering said first high-molecular compound film and an edge thereof.

2. An organic electroluminescent display panel according to claim 1, wherein said first high-molecular compound film is formed to have an area smaller than that of said first inorganic barrier film and larger than each of said organic electroluminescent elements.

3. An organic electroluminescent display panel according to claim 1, wherein said first high-molecular compound film is formed to cover said first inorganic barrier film an edge thereof, and a surface of the substrate around said first inorganic barrier film.

4. An organic electroluminescent display panel according to claim 1, further comprising a second high-molecular compound film having an area larger than each of said organic electroluminescent elements so as to partially cover said second inorganic barrier film thereover; and a third inorganic barrier film covering said second high-molecular compound and an edge thereof.

5. An organic electroluminescent display panel according to claim 1, wherein said inorganic barrier film is made of silicon nitride or silicon oxynitride.

6. An organic electroluminescent display panel according to claim 1, wherein said inorganic barrier film is formed by a plasma chemical vapor deposition process or a sputter deposition process or a catalytic chemical vapor deposition.

7. An organic electroluminescent display panel according to claim 1, wherein said high-molecular compound film is formed by a plasma polymerization deposition process or a chemical vapor deposition process or a spin-coating process or a vapor deposition polymerization.

8. An organic electroluminescent display panel according to claim 1, wherein said high-molecular compound film is made of polyparaxylylene or polyurea.

9. An organic electroluminescent display panel according to claim 1, wherein said substrate is a plastic substrate made of a high-molecular compound.

10. An organic electroluminescent display panel according to claim 9, further comprising an inorganic barrier film previously formed on the plastic substrate so as to cover a surface supporting said organic electroluminescent elements on said plastic substrate.

* * * * *